United States Patent [19]

Keil

[11] 3,977,873

[45] Aug. 31, 1976

[54] METHOD FOR PHOTO-FABRICATION INSPECTION USING A SUBLAYER OF CUPRIC CHLORIDE UNDER PHOTOSENSITIVE LAYER

[75] Inventor: James S. Keil, St. Louis County, Mo.

[73] Assignee: Kepro Circuit Systems Incorporated, St. Louis, Mo.

[22] Filed: Jan. 5, 1976

[21] Appl. No.: 646,599

[52] U.S. Cl. .............................. 96/27 R; 96/27 E; 96/36; 96/36.2; 156/3; 156/8
[51] Int. Cl.² ...................... G03C 5/00; G03C 5/04
[58] Field of Search ........... 96/36, 36.2, 27 R, 27 E, 96/27; 156/3, 8

[56] References Cited
UNITED STATES PATENTS 3,441,628    3/1976    Caule ................................. 96/36.2

OTHER PUBLICATIONS

"An Introduction to Photofabrication Using Kodak Photosensitive Resists," 1967, p. 25.

*Primary Examiner*—Edward C. Kimlin
*Attorney, Agent, or Firm*—Ralph W. Kalish

[57] ABSTRACT

A method for treating a surface of copper or copper alloy upon which a photo-etched pattern is to be provided comprising applying a relatively thin coating of cupric chloride formed from a relatively weak solution, drying said coating for moisture removal and then applying a photographic emulsion thereover. The thickness of the cupric chloride coating is approximately 1/10th or less that of the photographic emulsion and upon reaction to light emission effects a color change which is visible through the photographic emulsion thereby permitting rapid inspection of the ultimate pattern to be formed prior to performance of the customary developing, etching, and finishing techniques.

10 Claims, 10 Drawing Figures

U.S. Patent  Aug. 31, 1976  Sheet 1 of 2  3,977,873
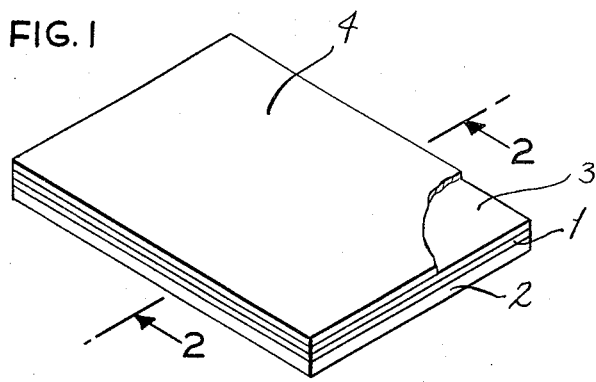
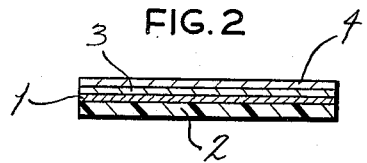
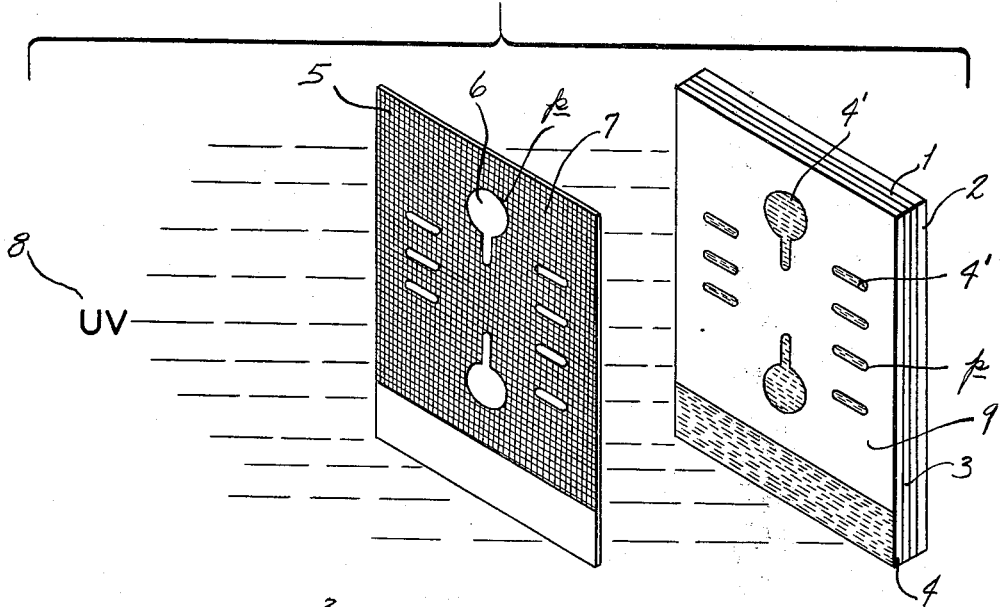
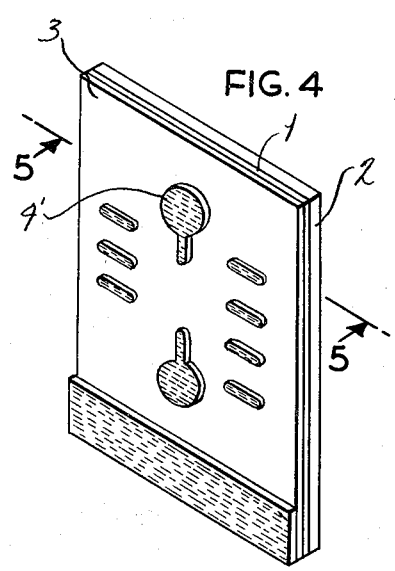
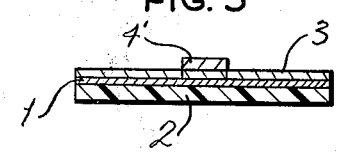

U.S. Patent   Aug. 31, 1976   Sheet 2 of 2   3,977,873
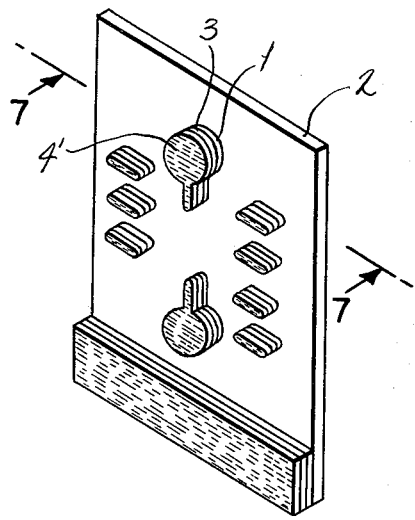
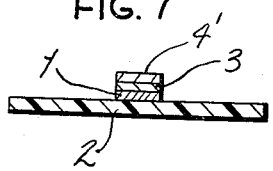
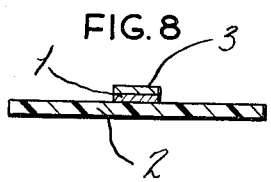
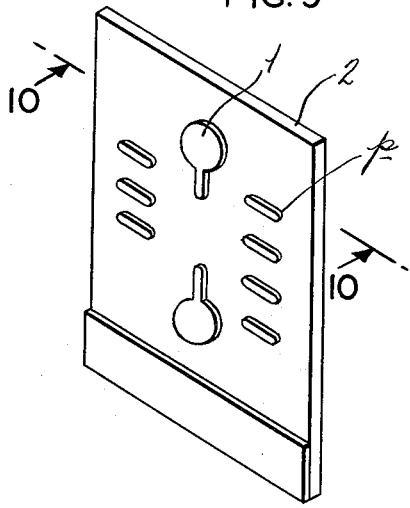
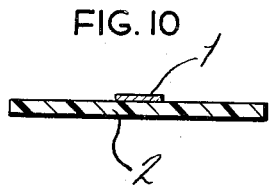

METHOD FOR PHOTO-FABRICATION INSPECTION USING A SUBLAYER OF CUPRIC CHLORIDE UNDER PHOTOSENSITIVE LAYER

BACKGROUND AND SUMMARY OF THE INVENTION

This invention relates in general to photo-fabrication and, more particularly, to a method for treating copper and copper alloys for image reproduction thereon by etching.

Heretofore, for example, in the field of etched circuits developed through photo-fabrication, it has been common practice to apply the so-called photo-resist or photographic emulsion directly upon the copper or copper alloy panel or plate. The particular negative is then positioned and the assembly subjected to a source of light, such as customarily ultraviolet. Upon withdrawal of the negative after light exposure, there is no pattern image or design upon the copper or copper alloy which is visible at such juncture and consequently there is no early or immediate indication of the character of the pattern to be ultimately reproduced so that only upon completion of the subsequent developing and finishing steps can the quality of the reproduced pattern be determined. Thus, the quality of the work to be effected is not capable of rapid determination but necessitates time consuming and costly efforts before the requisite inspection is possible.

Therefore, it is an object of the present invention to treat a copper or copper alloy surface for development thereon of an etched impression with an agent prior to application of the photo-resist whereby immediately consequent upon exposure to a light source the pattern is readily visible, permitting of inspection for determining potential sharpness and fidelity of the ultimate pattern, thereby obviating the necessity of effecting the customary developing techniques before ascertaining the character of the ultimate reproduced pattern.

It is another object of the present invention to provide a method for developing impressions within the field of photofabrication upon copper and copper alloys whereby the same are pre-treated for rapid inspection of the character of the pattern to be ultimately etched thereon.

It is a further object of the present invention to provide a method of the character stated which may be readily practiced by individuals having ordinary skill and training in the art; not requiring departure from techniques heretofore well known.

It is an additional object of the present invention to provide a method of the character stated which obviates the utilization of dies within the photo-resist or photographic emulsion utilized.

It is a still further object of the present invention to provide a method of the character indicated which aids in determining adequate development, that is, removal, of unexposed portions of the photographic emulsion.

It is another object of the present invention to provide a method of the character stated for determining the sufficiency of the removal of the photo-resist and the completeness of the post cleaning of the copper or copper alloy surfaces remaining to constitute the pattern for soldering and/or plating purposes.

It is an additional object of the present invention to provide a method of the character stated which is productive of substantial economies in operation; the use of which brings about a markedly improved product; and which does not require the utilization of costly laboratory apparatus for performance.

BRIEF DESCRIPTION OF THE DRAWINGS

FIG. 1 is a perspective view of a copper or copper alloy panel having applied thereon a coating in accordance with the present invention illustrating the same with the photographic emulsion applied thereover.

FIG. 2 is a vertical transverse sectional view taken on the line 2–2 of FIG. 1.

FIG. 3 is an exploded view illustrating the exposure of the copper or copper alloy panel to a light source through a negative.

FIG. 4 is a perspective view of the exposed copper or copper alloy panel subsequent to development, that is with removal of the non-light hardened photo-resist.

FIG. 5 is a horizontal transverse sectional view taken on the line 5—5 of FIG. 4.

FIG. 6 is a perspective view of the copper panel after etching.

FIG. 7 is a horizontal transverse sectional view taken on the line 7—7 of FIG. 6.

FIG. 8 is a horizontal transverse sectional view taken substantially on the line 7—7 of FIG. 6 but subsequent to stripping of the light hardened photo-resist.

FIG. 9 is a perspective view of the substrate having the resultant copper or copper alloy pattern thereon, after removal of the coating.

FIG. 10 is a horizontal transverse sectional view taken on the line 10—10 of FIG. 9.

DESCRIPTION OF THE PREFERRED EMBODIMENT

This invention contemplates the provision of a coating of cupric chloride on a copper or copper alloy surface adapted to have a pattern etched thereon. As will be shown more fully hereinbelow, it has been found that the provision of such coating permits of a ready visual determination of the pattern to be developed or reproduced immediately subsequent to exposure to the particular light source and prior to the actual developing, etching and finishing procedures. Thus, the user can rapidly determine at the earliest conceivable juncture any potential defects, such as in the negative, errors from positioning the negative; problems relative to the intensity of the light source, etc., etc. Furthermore, the pre-cleaning of the copper surface is readily effected and the contrast of the selectively exposed areas to unexposed areas permits of improved pattern inspection. The present invention also eliminates the need of application of dyes within the photo-resist or photographic emulsion, a practice which has been of relatively widespread use heretofore. Accordingly, the present invention finds a most significant utilization for the purpose of rapid inspection of ultraviolet light exposed areas of copper and copper alloys upon which a pattern is to be formed as by etching.

In describing the present method, resort will be made, for examplary purposes only, to the field of etched circuits, but it must be recognized that this invention may be used with equal facility in numerous other related areas of endeavor such as, name plates, plaques, and the like.

Referring now to the drawings which illustrate the use of the present invention in etched circuit boards, 1 designates a copper or copper alloy plate suitably mounted by conventional means upon a substrate 2, as of plastic or the like. The exposed face of the copper plate 1 has applied thereon a coating of cupric chloride, as at 3, such coating may be applied in any suitably currently practiced manner, such as, by dipping or spraying. The said coating is formed from an initial solution of cupric chloride having a specific gravity within the range of 36° – 38° Baume; and with a treatment solution developed therefrom having a concentration of from 1 to 16 ounces of the aforesaid initial solution per gallon of water to provide a reactive quantum of copper. With cupric chloride in hydrated form as $CuCl_2.2H_2O$, being used, the resultant or treatment solution has a concentration of the said compound within the range of 15 to 270 grams per gallon. If the anhydrous form of cupric chloride is used, the resultant or treatment solution has a concentration of such compound within the range of 12 to 213 grams per gallon.

After application of the said solution, the coated copper plate is then water rinsed which may be effected by spraying or dipping, and then the coated plate 1 is dried as by a chamois or cloth to effect moisture removal as rapidly as possible. The removal of moisture does not cause the cupric chloride coating to be withdrawn. Oven drying is not required. The now coated copper plate 1 takes on a relatively dull, generally golden hue as contradistinguished from the normal, shiny copper or brass-like color. The aforesaid coating is extremely fine and of markedly less thickness than that of the photo-resist or photographic emulsion 4 to be applied; being within the range of 1/10th or less the thickness of the photo-resist layer 4 which latter is usually between 1/10,000 and 3/10,000 of an inch so that the cupric chloride coating would, estimatedly, be between one and several millionths of an inch thick. After the cupric chloride coating 2 has been dried, the photo-resist 4 is applied thereover in accordance with well known and generally practised procedures. The photo-resist 4 may be of any suitable type, such as that identified as KODAK* photo-resist KPR, which is a negative-working resist widely used for printed circuit boards, photo-etching, and electro-forming; being a light sensitive emulsion. No claim is made herein to photo-resist 4 and the use thereof upon copper and copper alloy plates as the same does not form part of the present invention. As there is no reaction between the photo-resist and the cupric chloride coating, any type of photo-resist, whether negative- or positive-working could be used. Reference to the aforesaid KPR is for illustration only, as it is currently one of the most widely used in this particular field of endeavor.

*KODAK is a registered trademark of Eastman Kodak Company.

A negative, indicated at 5 in the drawing, embodying the pattern p to be reproduced, such as of a printed circuit, is then placed upon the opposite face of the photo-resist 4; said negative 5 having an arrangement of positive or clear and negative or opaque areas or zones 6, 7, respectively, coordinating to establish the particular pattern p. With a negative-working resist the exposed areas 4' of the resist, that is, those beneath the positive or clear zones 6 of negative 5 will remain on the surface after development, such being the usual type of resist in methods of the type hereunder study. The assembly consisting of the substrate 2, plate 1, coating 3, and resist 4 is then subjected to a source of ultraviolet light, as indicated at 8 (see FIG. 3), the emissions of which latter are of sufficient strength to penetrate the clear or positive zones 6 of negative 5 and cause a light hardening of the underlying portions of the photo-resist 4, as at 4'. Light will penetrate said light hardened portions 4' and cause a color change within the underlying cupric chloride coating 3, which is visible through said resist 4 so that upon exposure there is provided a reproduction of pattern p discernible by the naked eye (FIG. 3) which is obviously the reverse of that established by negative 5.

At this particular juncture in the fabrication procedure, there is permitted a certain marked departure from currently practiced methods which, although the same, are devoid of the benefits flowing from the incorporation of a cupric chloride coating on the copper or copper alloy plate 1 since there is now provided sharp delineation of the pattern p upon the assembly immediately after light exposure. Without the aforesaid coating of the present invention, the exposed assembly would appear to the naked eye just as the assembly illustrated in FIG. 1 so that the user would be totally unable to detect whether there had been an appropriately applied pattern by the negative 5. The pattern p upon the assembly through the exposure of the light through negative clear zone 6 is well delineated and of relatively dark gray tone providing excellent contrast with the unexposed areas, as indicated at 9. Thus, actually the cupric chloride coating undergoes a color change by reason of the impingement of the light so as to indicate the applied pattern p which is actually visible through the photo-resist 4 which is transparent, whether light hardened or otherwise. Although the principal of operation is not entirely understood, it is believed that the light causes a oxidation-reduction action of the fine layer of cupric chloride by reaction of the same with the underlying copper resulting in cuprous chloride which has a distinct coloration. The coating is so very thin that there is no serious loss of copper which would in any way effect the efficacy of the resultant pattern for forming the circuit or the like. Consequently, in viewing the drawings of the present invention, it must be recognized that in FIGS. 3, 4, and 6, the darkened areas are formed on the cupric chloride coating and are merely visible through the photo-resist 4.

The remaining finishing steps in the particular procedure are standard or conventional in character, commensurate with the particular end result desired so that as with etched circuits the light struck plate 1 is then subjected to developing by customary techniques which effect the removal of the portions of the resist or emulsion 4 as indicated at 9, which have not been light hardened, that is those portions which underlay the negative or opaque zone 7 of negative 5, as may best be seen in FIG. 3 so that the assembly will take on the appearance as shown in FIG. 4. The developing agent is entirely of conventional character and does not in any way react with the layer of cupric chloride 3 regardless of whether such portions of said layer have or have not been light exposed. Manifestly, the developer utilized is understandably one that is compatible with the particular emulsion and thus the determination thereof is clearly within the scope of one having ordinary skills in the art.

After completion of the developing step the assembly in cross section is illustrated in FIG. 5 with the unhardened portions of the emulsion being removed. The subsequent normal step is then to submit the assembly to an etching bath wherein the etchant may be cupric chloride or any other etchant normally used with copper or copper alloy. The etching technique is entirely in accord with general practice, that is, from the standpoint of the etchant utilized, the strength thereof, the manner of subjection to the bath, the duration of the treatment, etc. In other words, the mere provision of the cupric chloride coating 3 causes no alteration or modification whatever in the etching step. FIG. 6 thus demonstrates the condition of the assembly after etching wherein there remains upon the substrate the copper or copper alloy 1 which underlay the light hardened portions of the photo-resist with the remaining portions of the cupric chloride sandwiched therebetween.

In accordance with expected procedure, the etchant acts upon the portions of copper or copper alloy, as the case may be, of plate 1 which have not been protected by the light hardened emulsion portions 4' and which action thus removes such unprotected copper from plate 1 (see FIG. 6 and 7); it being recognized that the chloride coating does not in any way impede or constitute an obstacle to the efficacy of the etching action and the unprotected portions thereof are effectively removed concurrently. Thus, as with any like etching step, the copper remaining upon plate 1 forms the ultimate desired patern $p$ although such remaining copper is still covered by coating 2 and the overlying portions of the light hardened resist 4'. After etching, the remaining assembly is then subjected to the usual stripping of the remaining light hardened emulsion portions 4', as into the condition shown in FIG. 8, and which stripping is normally effected by use of applicable well known solvents, many of which are of chlorinated character; however, such solvents do not cause removal of the cupric chloride portion which erstwhile underlay the now removed light hardened emulsion portions 4'.

Thereupon the usual copper cleaning action is undertaken which will be effected by the use of ammonium or sodium persulfate which are generally used for such purpose and such cleansing agents also cause removal of the cupric chloride leaving merely the remaining copper pattern-forming elements as shown in FIGS. 9 and 10. Such last mentioned chemicals also have the property, widely known, to prepare the remaining pattern-forming copper plate 1 for subsequent soldering or plating as dictated by the ultimate purpose. For the stated purposes the said persulfates are in a solution having a concentration of at least two ounces per gallon of water.

If desired, prior to the etching treatment, that is, immediately subsequent to the developing step, the remaining assembly may be subjected to treatment by one of the aforesaid persulfates so as to remove the cupric chloride coating which was unexposed, that is, which does not underlie light hardened portions of resist 4 and by such removal accentuate the exposed areas for developing contract between the bare copper and the remaining areas of the plate 1.

As described above, the present invention is useful with all types of photo-resist as there is no reaction between the photo-resist used and the cupric chloride coating. Consequently, the present invention is most versatile having application through the broad field of photo-fabrication involving copper and copper alloy treated surfaces.

Accordingly, the foregoing demonstrates the interposition of the single step of providing a relatively thin coating of cupric chloride upon a copper or copper alloy surface prior to photo-fabrication techniques involving etching, which interposition does not require any alteration in the performance of the usual procedures for exposure, development, etching, cleaning, finishing, etc. Such coating merely conduces to a wholly unexpected discernible pattern development immediately upon light exposure so that inspection of the ultimate pattern to be established may be readily determined without further effort.

Having described my invention, what I claim and desire to obtain by Letters Patent is:

1. In a method for rapidly inspecting a pattern to be photo-fabricationally provided on a surface from the class consisting of copper or alloys of copper comprising providing a coating of cupric chloride upon the said surface, providing a transparent photographic emulsion upon said coating, presenting a negative upon said emulsion carrying the pattern to be ultimately established on said surface, subjecting the assembly to a source of ultraviolet light, and thereupon visually inspecting the pattern to be formed by examination of color changes within the cupric chloride coating underlying the portions of the emulsion which have been light struck through the negative.

2. In a method as defined in claim 1 and further characterized by said cupric chloride coating being provided in solution form, and then removing the moisture from such applied solution.

3. In a method as defined in claim 1 and further characterized by said cupric chloride solution being formed from hydrated cupric chloride.

4. In a method as defined in claim 1 and further characterized by said cupric chloride solution being formed from anhydrous cupric chloride.

5. In a method as defined in claim 3 and further characterized by said cupric chloride solution having a concentration of 15 to 270 grams per gallon of hydrated cupric chloride.

6. In a method as defined in claim 3 and further characterized by said cupric chloride solution having a concentration of 12 to 213 grams per gallon of anhydrous cupric chloride.

7. In a method as defined in claim 2 and further characterized by applying said coating of cupric chloride solution upon said copper or copper alloy surface by dipping the latter in said solution.

8. In a method as defined in claim 2 and further characterized by said cupric chloride coating being provided on said copper or copper alloy surface by spraying said cupric chloride solution thereon.

9. In a method as defined in claim 2 and further characterized by said drying of said surface being effected by application of an absorbent member.

10. In a method as defined in claim 4 and further characterized by the resultant thickness of said coating being within the range of 1/10th or less the thickness of the photographic emulsion.

* * * * *